United States Patent [19]

Kovacs et al.

[11] Patent Number: 6,144,981
[45] Date of Patent: Nov. 7, 2000

[54] PROGRAMMABLE PULSE SLIMMER SYSTEM FOR LOW PASS LADDER FILTER

[75] Inventors: Janos Kovacs, North Andover; Kevin J. McCall, Leominster, both of Mass.

[73] Assignee: Analog Devices, Inc., Norwood, Mass.

[21] Appl. No.: 09/174,944

[22] Filed: Oct. 19, 1998

[51] Int. Cl.[7] .................................................. G06G 7/02
[52] U.S. Cl. ............................................................ 708/819
[58] Field of Search ............................. 708/819; 327/558

[56] References Cited

U.S. PATENT DOCUMENTS 4,839,542  6/1989  Robinson .................................. 327/558
5,235,540  8/1993  DeVeirman .

*Primary Examiner*—Tan V. Mai
*Attorney, Agent, or Firm*—Kirk Teska; Iandiorio & Teska

[57] ABSTRACT

A programmable pulse slimmer system for a low pass ladder filter includes a filter input current source for providing to a low pass ladder filter the input signal to be filtered; and a high frequency boost current source for injecting into the low pass ladder filter forward of the first inductor device a high frequency load current which is a scaled inverse replica of the input signal to provide gain at the high frequency end of the low pass band of the low pass ladder filter.

9 Claims, 5 Drawing Sheets

6,144,981

PROGRAMMABLE PULSE SLIMMER SYSTEM FOR LOW PASS LADDER FILTER

FIELD OF INVENTION

This invention relates to a programmable pulse slimmer system for a low pass ladder filter.

BACKGROUND OF INVENTION

Programmable low pass filters find wide use in communications and sound reproduction systems. Throughout this background, specification and claims, by programmable is meant automatic or manual adjustable or variable. Often in such applications it is desirable to have a pulse slimming feature that is to have a high frequency boost to increase the strength of the higher frequencies passed by the programmable low pass filter. Integrated current programmable biquad low pass filters using transconductance ($g_m$) amplifiers provide such high frequency boost but the transfer function high component sensitivity. Another structure for programmable low pass filters, known as ladder filters, have been implemented with either passive LC components or active $g_m$ amplifiers. Programmable passive LC low pass ladder filters with high frequency boost are not known. There are programmable active transconductance low pass ladder filters with high frequency boost which combine the output signal with its differential derivative to obtain the high frequency boost but this increases the high frequency noise in the final output signal.

SUMMARY OF INVENTION

It is therefore an object of this invention to provide a programmable pulse slimmer system for a low pass ladder filter.

It is a further object of this invention to provide such a programmable pulse slimmer system which is applicable to low pass ladder filters implemented with active or passive inductor devices.

It is a further object of this invention to provide such a programmable pulse slimmer system which compensates for low frequency gain loss due to high frequency boost.

It is a further object of this invention to provide such a programmable pulse slimmer system that increases the utility of low pass ladder filters which have lower component sensitivity than equivalent biquad filters and requires fewer components and less area and power in integrated circuit constructions.

The invention results from the realization that a programmable pulse slimmer system for a low pass ladder filter can be effected by injecting forward of the first inductor device in the ladder filter, a high frequency boost current which is a scaled inverse replica of the input current to be filtered and further that the loss of gain at lower frequencies due to the high frequency boost can be compensated by injecting into the input of the ladder filter a compensation current which is a scaled replica of the input current.

This invention features a programmable pulse slimmer system for a low pass ladder filter including a filter input current source for providing to a low pass ladder filter the input signal to be filtered; and a high frequency boost current source for injecting into the low pass ladder filter forward of the first inductor device a high frequency load current which is a scaled inverse replica of the input signal to provide gain at the high frequency end of the low pass band of the low pass ladder filter.

In a preferred embodiment there may be a gain compensation current source for injecting at the input of the ladder filter a gain compensation current which is a scaled replica of the input signal for compensating for the loss in gain due to the injection of the high frequency boost current. The first inductor device may include an inductance or it may include an inductance emulator circuit including a pair of gyrators and a capacitance. The gyrator may include a pair of cross connected transconductance amplifiers. The input current source may include a transconductance amplifier. The high frequency boost current source may include a transconductance amplifier. The gain compensation current source may include a transconductance amplifier. The sum of the high frequency boost current and the gain compensation current may be constant.

DISCLOSURE OF PREFERRED EMBODIMENT

Other objects, features and advantages will occur to those skilled in the art from the following description of a preferred embodiment and the accompanying drawings, in which.

Figure 1:
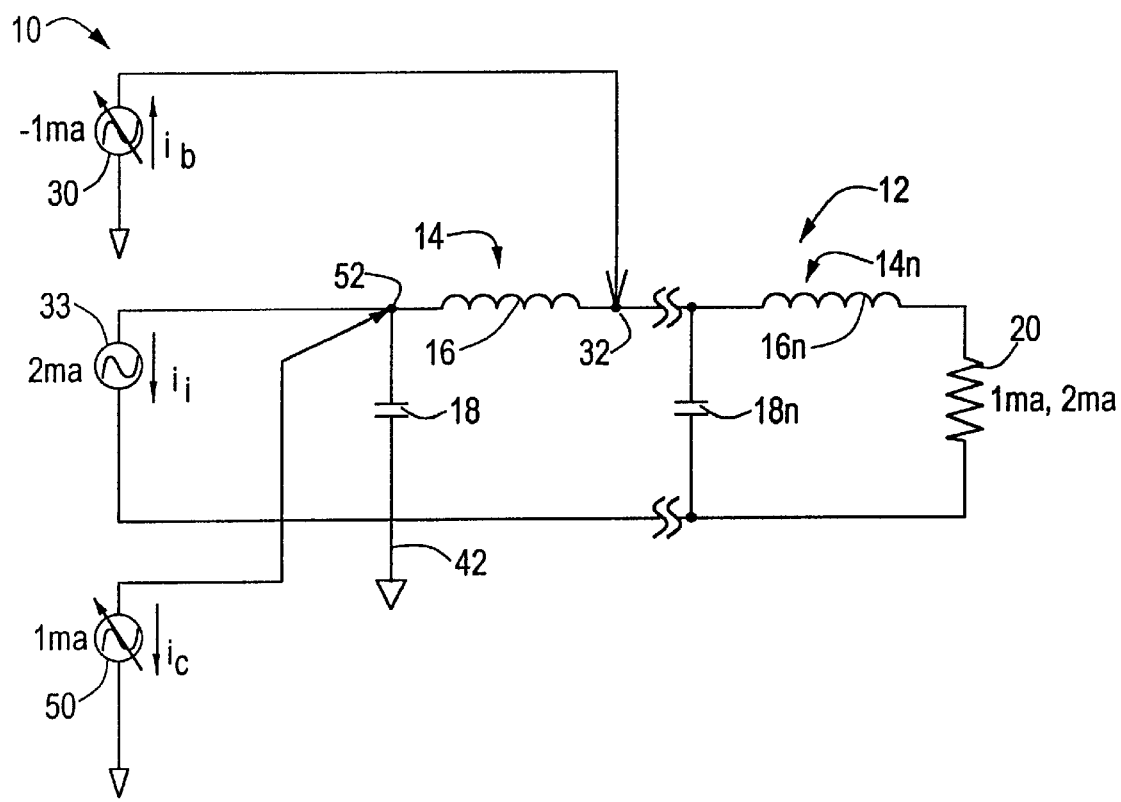
FIG. 1 is a schematic diagram of a programmable pulse slimmer system controlling a low pass ladder filter according to this invention.

There is shown in FIG. 1 a programmable pulse slimmer system 10 according to this invention and a low pass ladder filter 12. Ladder filter 12 includes a first filter stage 14 including an inductance device 16 and a capacitor 18. There may be any number of additional such stages as represented by stage 14n. A termination resistor 20 is connected across the output. Programmable pulse slimmer system 10 includes a programmable or variable current source 30 and a current source 33 which represents the source of the input signal which is to be filtered by ladder filter 12.

Figure 2:
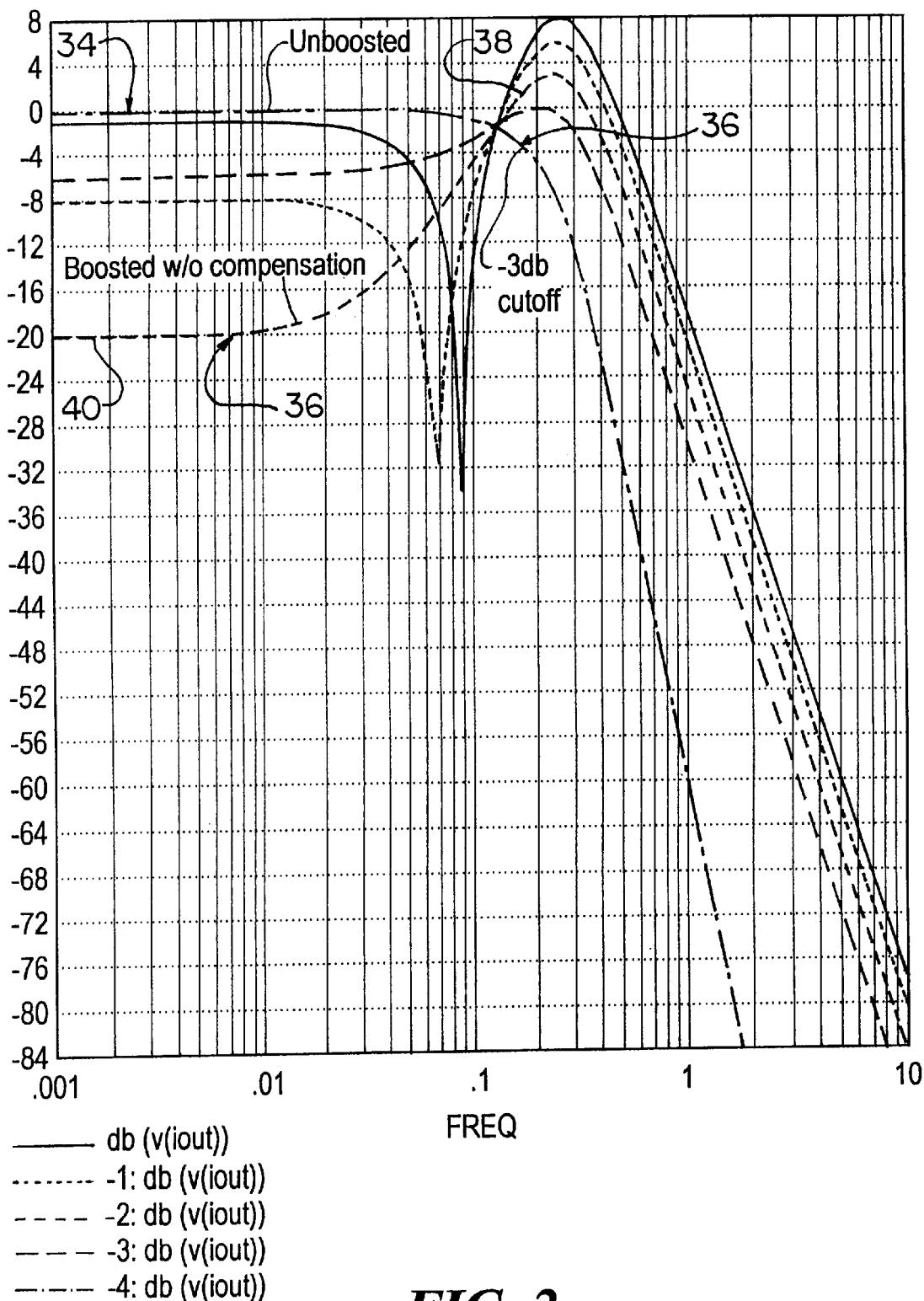
FIG. 2 is an illustration of the transfer function of a low pass ladder filter without a high frequency boost and a second transfer function with a high frequency boost but without gain compensation.

In accordance with this invention the current source 30 provides a high frequency boost current $i_b$ to be interjected at point 32 forward of the first inductance device 16. (Current $i_b$ is an inverse scaled replica of the input current $i_i$. Normally, without the injection of a boost current $i_b$ the unboosted characteristic curve 34, FIG. 2, is flat nearly to its cutoff point 36 at −3 db. By injecting $i_b$ which is an inverse scaled replica of input current $i_i$, the boosted characteristic curve 36, FIG. 2, is obtained where it can be seen that the amplitude of the higher frequencies at the upper end 38 of the bandpass is considerably increased with respect to the lower frequencies 40.

This is accomplished by the injection of $i_b$ at point 32. Thus, for example, if $i_i$ is 2 milliamps and $i_b$ is −1 milliamp at frequencies within the passband of the low pass filter the combination of −1 milliamp and +2 milliamps will provide a reduced 1 milliamp signal at output resistor 20. However, as the higher frequency upper end of the low pass band is approached, the combination of inductor device 16 and capacitance 18 approach resonance and begin acting as a shunt as seen from point 32 so that the injected current $i_b$ is drawn off to ground 42 and does not detract from the input current $i_i$. This leaves the input current $i_i$ at its full 2 milliamps and so there will be a 2 milliamp current signal at output resistor 20. This results in the characteristic 36, FIG. 2, which has a lowered pass band in the area 40 but an relatively enhanced power output in the region 38.

Figure 3:
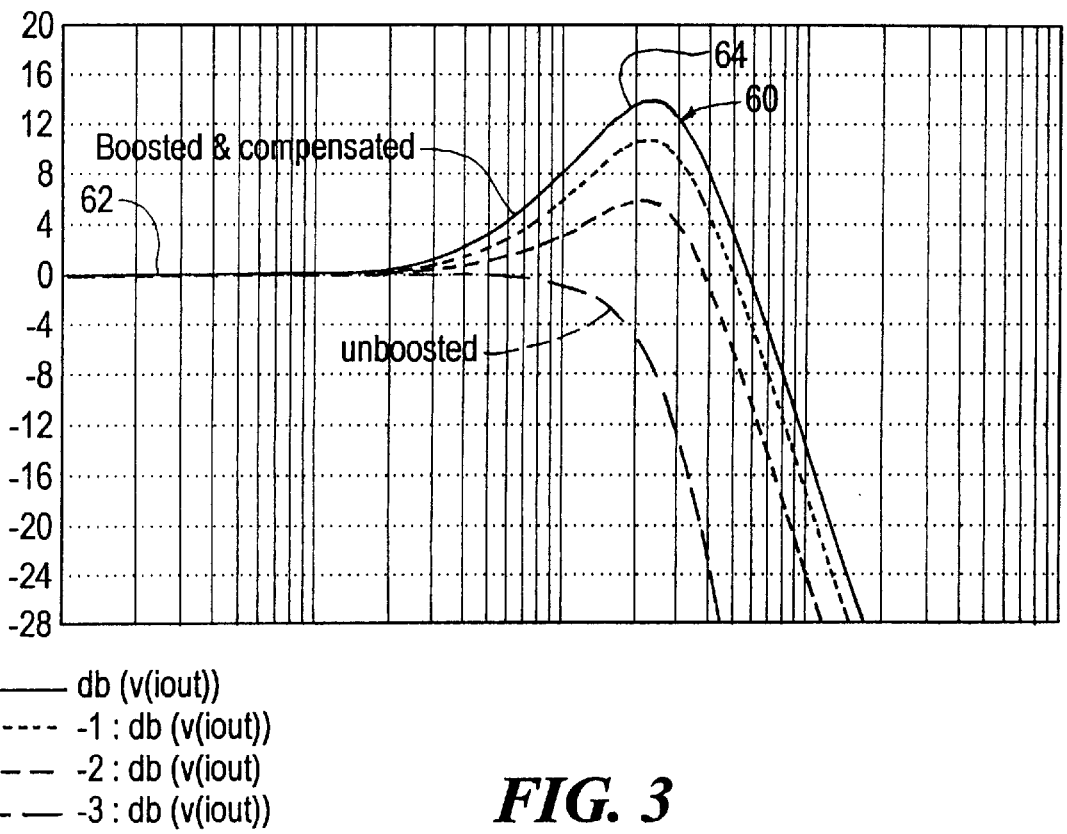
FIG. 3 is an illustration similar to FIG. 1 showing the transfer function without high frequency boost and with high frequency boost and gain compensation.

Often it is not desirable to have the enhanced higher frequency region 38 at the cost of having the lower region 40. To compensate for this another variable current source, compensation current source 50, FIG. 1, may be employed which provides the compensation current $i_c$ at an input node 52 of ladder filter 12. Current $i_c$ is a scaled replica of input current $i_i$ but it is not inverse as the high frequency boost current $i_b$. Compensation current $i_c$ combines with the input current $i_i$ to bring the level in region 40, FIG. 2, back up to the level of the unboosted signal 34. Thus, maintaining the example of $i_i$ equal to 2 milliamps and $i_e$ equal to 1 milliamp, $i_c$ might be made equal to 1 milliamp. Then, even when at lower frequencies the injected boost current $i_e$ of 1 milliamp combines with the input current of +2 milliamps to provide amount of 1 milliamp, the presence of the compensation current $i_c$ of 1 milliamp will increase the output current back to 2 milliamps. This provides the characteristic curve 60, FIG. 3, for a high frequency boosted and gain compensated system wherein the lower frequencies at 62 are maintained at the same zero decibel level as the unboosted characteristic 34 in FIG. 2 while providing the high frequency boost 64. To improve linearity the compensation current $i_c$ may be structured so that the summation of $i_c$ and $i_b$ always remain constant: that is, as one increases the other decreases.

Figure 4:
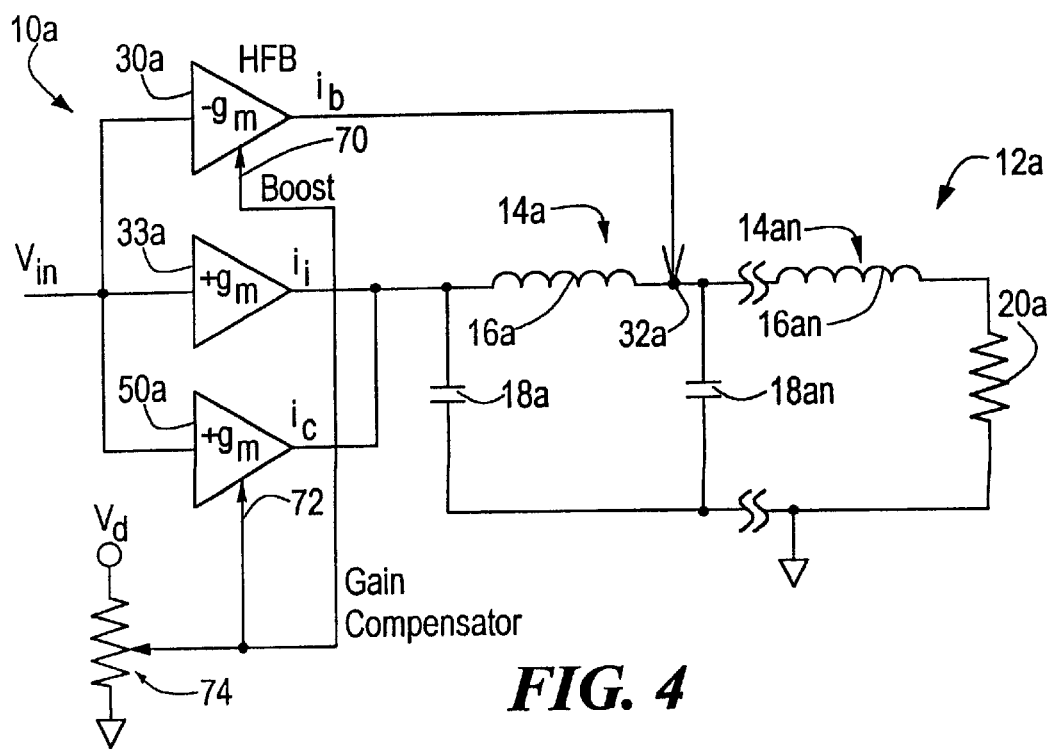
FIG. 4 is a view similar to FIG. 1 with the current sources implemented by transconductance amplifiers.

In one embodiment the current sources 30, 33 and 50 may be replaced by transconductance amplifiers 30a, 33a and 50a as shown in FIG. 4. Transconductance amplifier 30a is indicated as an inverting or transconductance amplifier $-g_m$ to represent that it provides a signal which is a scaled replica but the inverse of that produced by the normal or plus transconductance amplifier 33a. Transconductance amplifier 50a is a standard or plus transconductance amplifier $+g_m$, the same as amplifier 33a. Throughout the specification identical parts have been given identical numbers and similar parts have been given identical numbers accompanied by lower case letters, primes, or additional numbers. Transconductance amplifiers 30a and 50a are programmable or adjustable by a voltage applied to their control inputs 70, 72 from some controllable input, for example, variable resistance 74 connected between voltage $V_d$ and ground. A differential implementation of a low pass ladder filter 12b, FIG. 5, includes two channels, Channel I and Channel II. Channel I includes a series of LC stages 14b1, 14b2 while Channel II has a series of stages 14c1, 14c2. Stage 14b1 includes an inductance 16b1 and capacitance 18b1. Stage 14b2 similarly includes inductance 16b2 and capacitance 18b2. Also included in Channel I is a capacitance 18b3 and output resistance 22b which in conjunction with the output resistance 22c of Channel II makes up the total output resistance. Channel II includes stage 14c1 having a capacitor 18c1 and inductance 16c1 and a stage 14c2 having an inductance 16c2 and capacitance 18c2.

There is also a capacitance 18c3 in Channel II. The injection points for the boost currents are indicated at 32b and 32c.

In this case, each of the transconductance amplifiers 30b, 33b, 50b has dual complementary outputs. Thus input amplifier 33b provides a positive input current $i_{i1}$ to Channel I and a negative input $-i_{i2}$ to Channel II. The high frequency boost transconductance amplifier 30b thus provides a negative high frequency boost current $-i_{b1}$ at injection point 32b for Channel I and provides a positive high frequency boost current $+i_{b2}$ at the injection point 32c for Channel II, and since the input current $i_{i1}$ to Channel I is positive so too must the compensation current $i_{c1}$ be positive, and since the input current for Channel I is negative, $-i_{i2}$, so too must the compensation current be negative, $-i_{c2}$.

Figure 5:
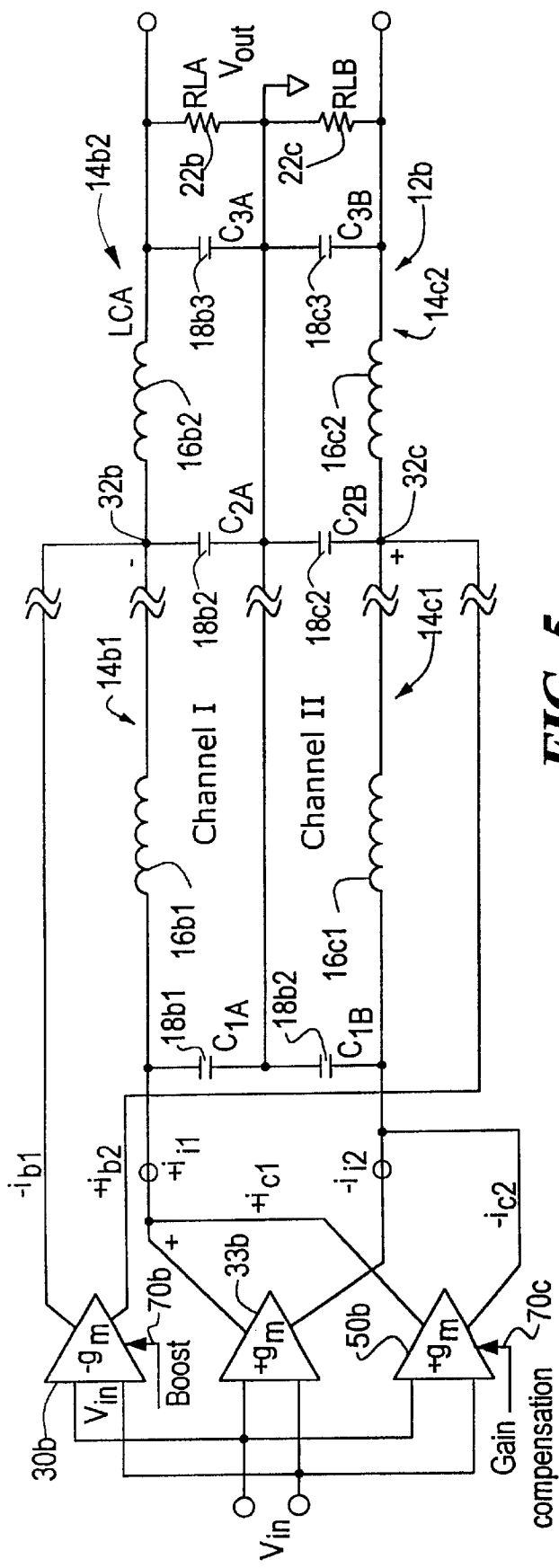
FIG. 5 is a schematic diagram of a differential implementation of a programmable pulse slimmer system according to this invention with a low pass ladder filter.
Figure 6:
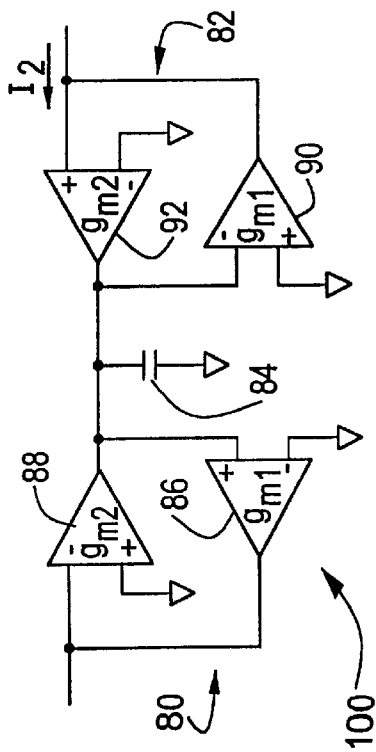
FIG. 6 is a schematic diagram of an inductance emulating circuit.
Figure 7:
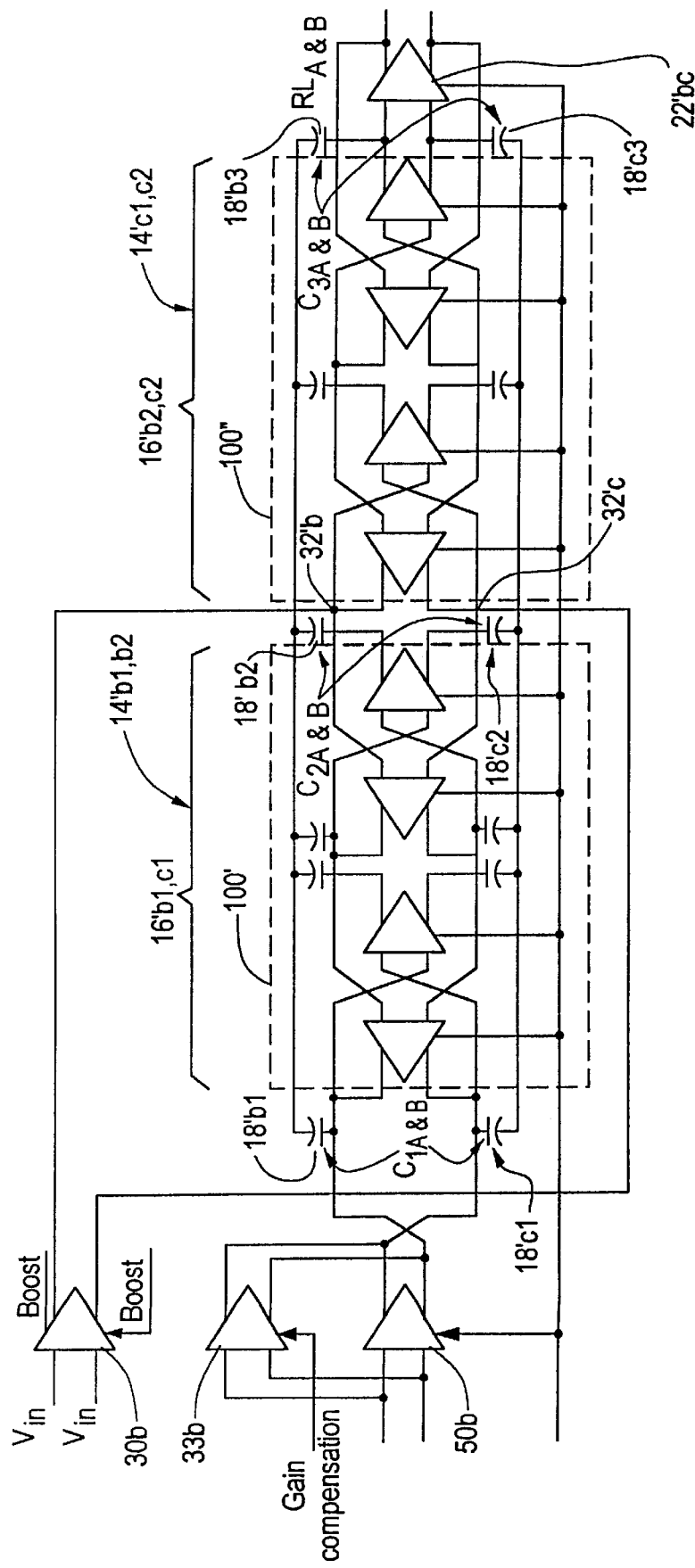
FIG. 7 is a schematic diagram of a programmable pulse slimmer system according to this invention similar to that of FIG. 5 but with the low pass ladder filter implemented using the inductance emulator circuits of FIG. 6.

While ladder filter 12b, FIG. 5, is shown as implemented by passive traditional LC components, this is not a necessary limitation of the invention. For example, each of the inductances 16b1, 16c1, 16b2, 16c2 in FIG. 5, may be implemented using a pair of gyrators 80, 82 connected as shown in FIG. 6, whereby the capacitance 84 is made to function as an inductance in a well-known way. In FIG. 6 each of the gyrators 80, 82 is formed from a pair of cross coupled transconductance amplifiers 86 and 88, 90 and 92, respectively, but other forms of gyrators may be used. Thus the entire configuration of transconductance amplifier 86, 88, 90 and 92, and capacitance 84 form an inductance device 100. Such an inductance device may be employed as at 100', FIG. 7, to implement inductances 16'b1, 16'c1 and another inductance device 100" may be used to implement inductances 16'b2, 16'c2.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A programmable pulse slimmer system for a low pass ladder filter comprising:

a filter input current source for providing to a low pass ladder filter the input signal to be filtered; and a high frequency boost current source for injecting into the low pass ladder filter forward of the first inductor device a high frequency load current which is a scaled inverse replica of the input signal to provide gain at the high frequency end of the low pass band of the low pass ladder filter.

2. The programmable pulse slimmer system for a low pass ladder filter of claim 1 further including a gain compensation current source for injecting at the input of the ladder filter a gain compensation current which is a scaled replica of the input signal for compensating for the loss in gain due to the injection of the high frequency boost current.

3. The programmable pulse slimmer system for a low pass ladder filter of claim 2 in which said gain compensation current source includes a transconductance amplifier.

4. The programmable pulse slimmer system for a low pass ladder filter of claim 2 in which the sum of said high frequency boost current and said gain compensation current is constant.

5. The programmable pulse slimmer system for a low pass ladder filter of claim 1 in which the first inductor device includes an inductance.

6. The programmable pulse slimmer system for a low pass ladder filter of claim 1 in which the first inductor device includes an inductance emulator circuit including a pair of gyrators and a capacitance.

7. The programmable pulse slimmer system for a low pass ladder filter of claim 1 in which each said gyrator includes a pair of cross connected transconductance amplifiers.

8. The programmable pulse slimmer system for a low pass ladder filter of claim 1 in which said input current source includes a transconductance amplifier.

9. The programmable pulse slimmer system for a low pass ladder filter of claim 8 in which said high frequency boost current source includes a transconductance amplifier.

* * * * *